United States Patent [19]

Zasio et al.

[11] Patent Number: 4,458,129
[45] Date of Patent: Jul. 3, 1984

[54] DISCHARGE DEVICE AND METHOD FOR USE IN PROCESSING SEMICONDUCTOR DEVICES

[75] Inventors: John J. Zasio, Sunnyvale; Michael W. Samuels, San Jose, both of Calif.

[73] Assignee: Fujitsu, Limited, Kawasaki, Japan

[21] Appl. No.: 356,951

[22] Filed: Mar. 11, 1982

Related U.S. Application Data

[60] Division of Ser. No. 098,523, Nov. 29, 1979, Pat. No. 4,350,866, which is a continuation of Ser. No. 840,674, Oct. 11, 1977, abandoned.

[51] Int. Cl.³ .......................... B01J 17/00; B23P 1/00
[52] U.S. Cl. ........................ 219/68; 219/69 R; 219/121 EK; 219/69 M; 269/903; 29/586; 29/584
[58] Field of Search ............... 219/121 EJ, 121 EK, 219/68, 69 V, 69 R, 69 M, 113, 92, 121 EM; 269/903; 29/584, 586

[56] References Cited

U.S. PATENT DOCUMENTS

| | | | |
|---|---|---|---|
| 3,324,276 | 6/1967 | Osenbrugger et al. | 219/69 V |
| 3,646,305 | 2/1972 | Schmidtke et al. | 219/113 |
| 3,851,382 | 12/1974 | Stork | 219/121 EK |
| 3,875,416 | 1/1975 | Spicer | 219/121 EV |
| 4,060,888 | 12/1977 | Bottom et al. | 219/92 |

OTHER PUBLICATIONS

Metals Handbook, "Electron Beam Welding", p. 545, vol. 6, 8 Edition, 5-1974.

*Primary Examiner*—M. H. Paschall
*Attorney, Agent, or Firm*—Flehr, Hohbach, Test, Albritton & Herbert

[57] ABSTRACT

An electrical discharge is applied to a wafer mounted in a wafer holder. The wafer includes at least one conducting region covered by an insulating layer. The discharge causes a conductive channel from the conductive region through the insulating layer. The conductive channel provides a relatively low impedance path suitable for conducting away electrons which are injected into the region during processing steps such as electron beam exposure.

9 Claims, 7 Drawing Figures

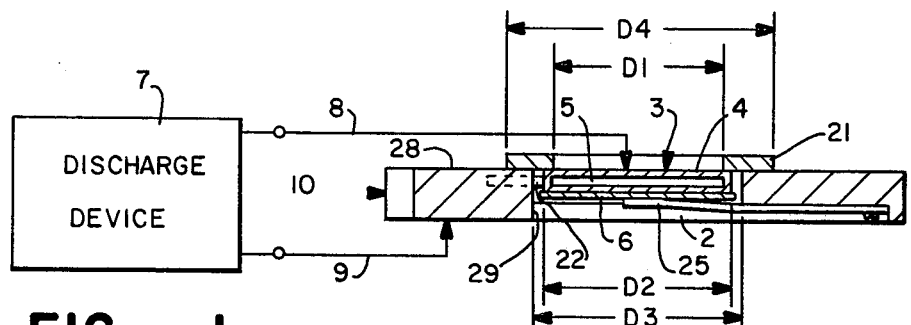
FIG.—1
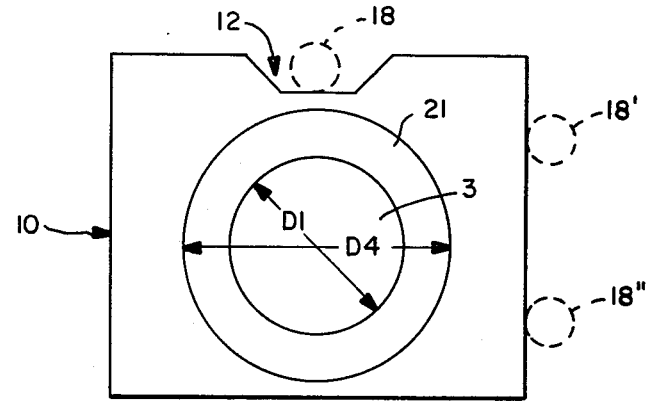
FIG.—2
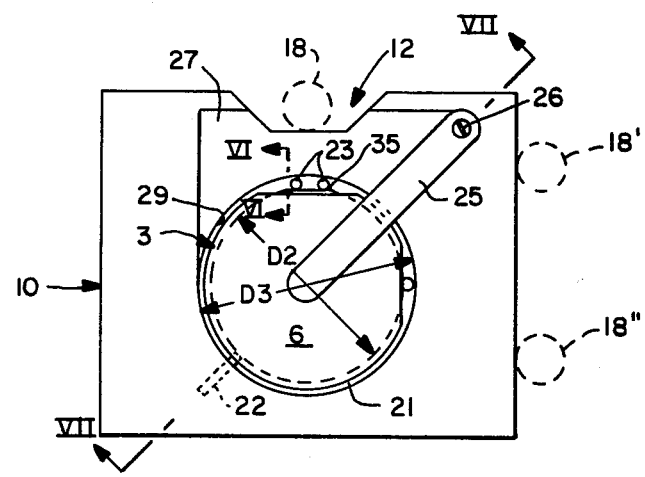
FIG.—3
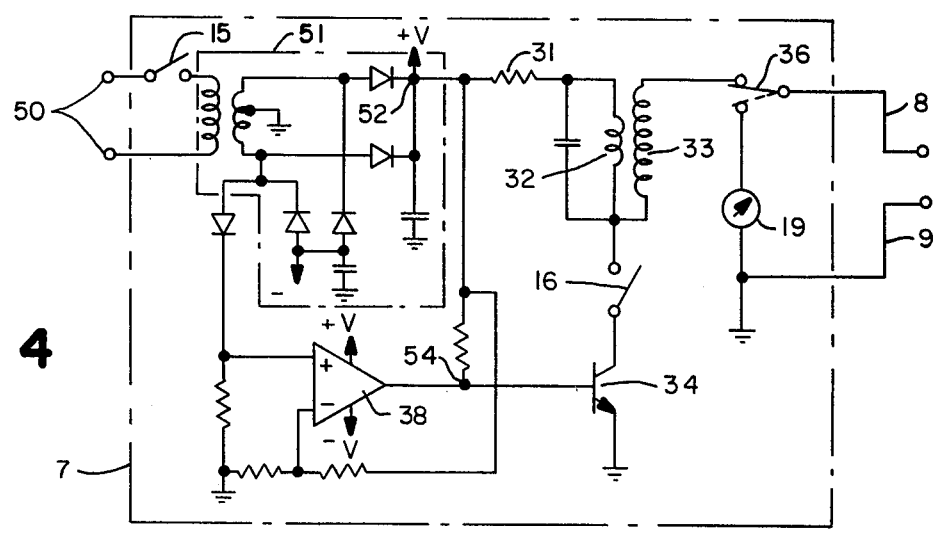
FIG.—4

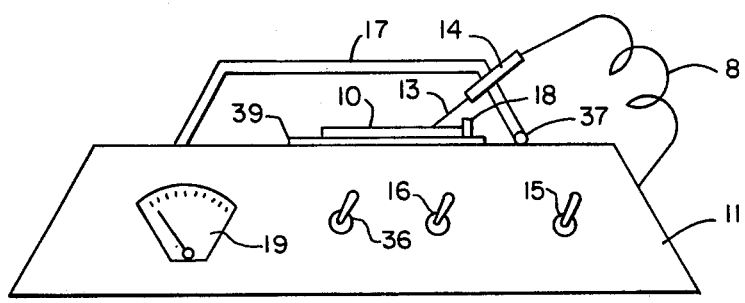
FIG.—5
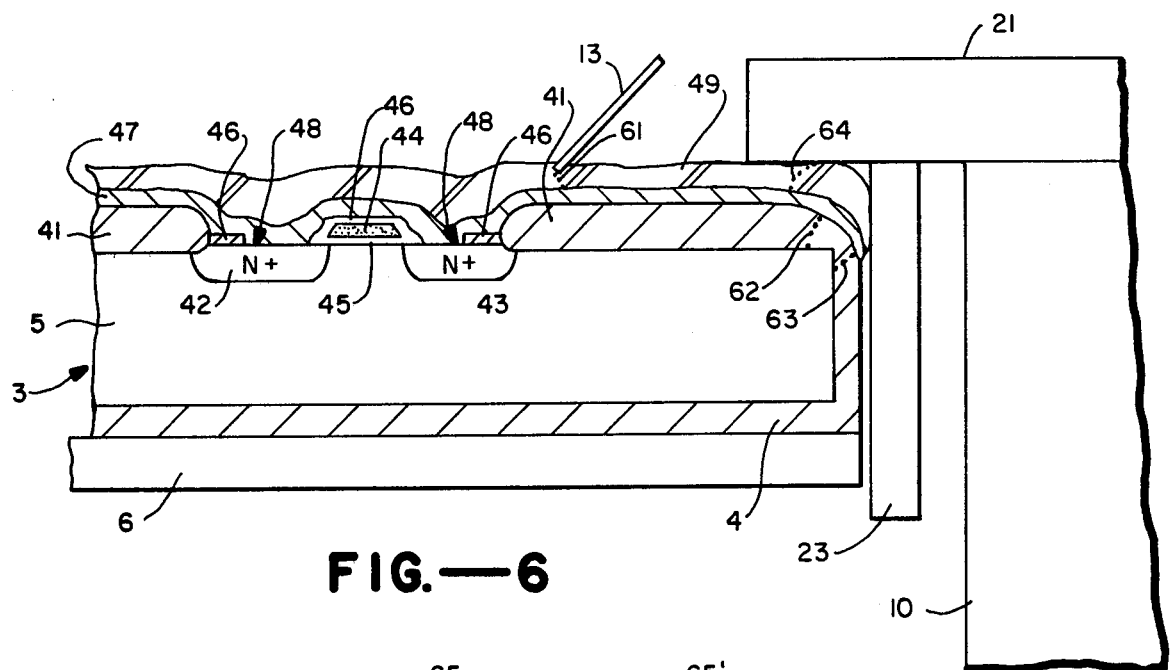
FIG.—6
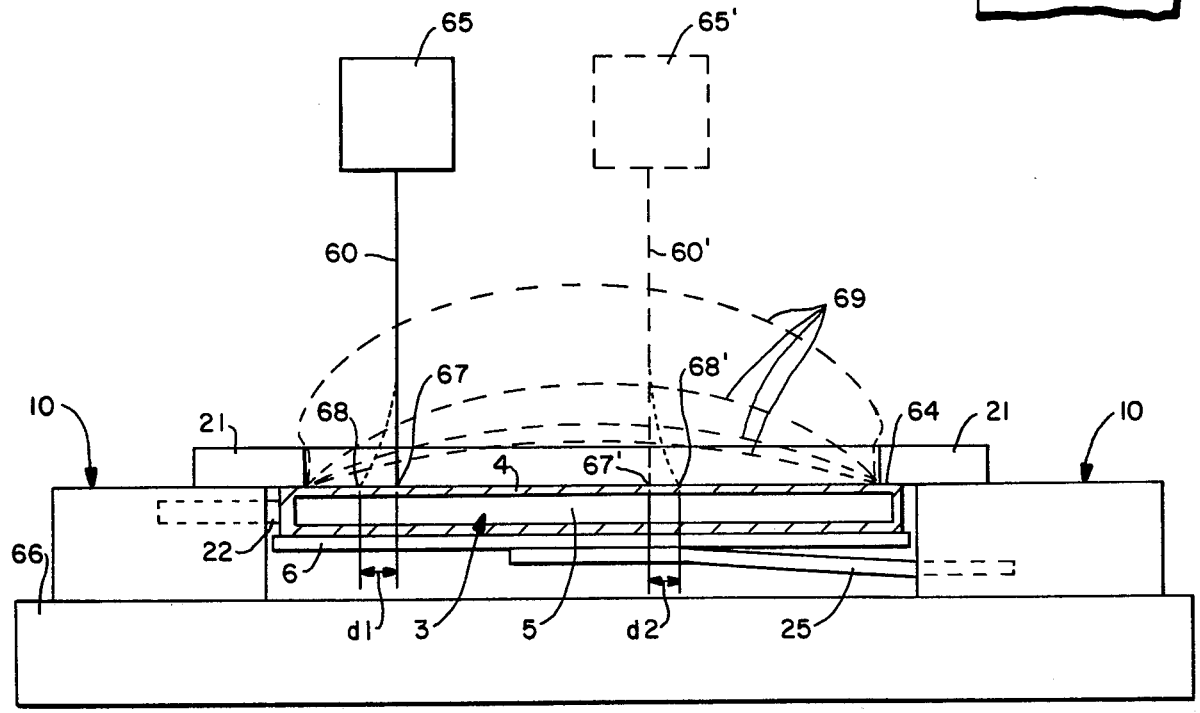
FIG.—7

DISCHARGE DEVICE AND METHOD FOR USE IN PROCESSING SEMICONDUCTOR DEVICES

This is a division of application Ser. No. 98,523, now U.S. Pat. No. 4,350,866 filed Nov. 29, 1979 which in turn is a continuation of application Ser. No. 840,674 filed Oct. 11, 1977, now abandoned.

CROSS REFERENCE TO RELATED APPLICATIONS

Wafer Holder With Spring-Loaded Wafer-Holding Means, Ser. No. 845,496, filed Oct. 26, 1977, invented by Gabriel Zasio and assigned to the assignee of the present invention.

BACKGROUND OF THE INVENTION

The present invention relates to an apparatus and method for making electrical connections between a conductive region through an insulating layer and more particularly to a method for use in the manufacture of semiconductor devices which prevents charge accumulation during exposure by a charged beam.

The use of charged beams, such as electron beams, in manufacturing processes has been known for many years. For example, in the manufacturing of various types of semiconductor devices, an electron beam is scanned to provide accurate exposure of a pattern. The electron beam processes are generally more accurate than other forms of pattern generation. In one example using electron beam technology, a semiconductor wafer to be processed is coated with an electron beam resist. The wafer is usually formed by a semiconductor material such as doped silicon covered by a silicon dioxide or other insulating layers. The semiconductor wafer, including the silicon dioxide layer and the resist layer, are placed in a metal holder prior to exposure by the electron beam. The holder-mounted wafer is then placed in an electron beam exposure apparatus. The electron beam apparatus normally includes automatic means for controlling the deflection of the electron beam and hence for controlling the position of the electron beam as it impinges upon the resist-covered wafer. The deflecting (or scanning) of the electron beam causes a pattern to be exposed in the electron beam resist coated on the surface of a wafer.

In a typical example, the electron beam is incident upon the resist with a spot diameter of one-half micron and the electron beam spot is deflectable to an accuracy of 0.02 micron or better. Such an accuracy in an electron beam apparatus is readily achievable with conventional electron beam systems currently available from manufacturers. While the inherent high accuracy of the electron beam apparatus has lead to semiconductor processing steps which achieve semiconductor device patterns having similar high accuracy, certain problems have resulted due to the charge accumulation in a semiconductor wafer caused by the electron beam.

A wafer to be exposed includes a conductive region (such as a semiconductive region or base formed by doped silicon), includes an insulator (such as silicon dioxide), and includes an electron beam resist layer. When the wafer is exposed to an electron beam, a charge accumulation occurs in the conductive region. The charge accumulation occurs because electrons from the incident electron beam are injected through the electron beam resist layer, through the insulating layer and into the conductive region. If the conductive region is not connected through a conductive channel to a charge sink, then a charge is accumulated in the conductive region. The magnitude of the charge is generally a function, among other things, of the current in the incident electron beam, the duration of charge accumulation, and the conductivity between the conductive region and a discharge sink. Any accumulated charge, of course, produces an unwanted electrostatic field. Although the charge distribution within the conductive region may be generally uniform, the electrostatic field pattern outside the semiconductor wafer, and through which the electron beam must pass, is not uniform. The magnitude of the electrostatic field varies as a function of the position of the wafer with respect to the incident electron beam in a plane normal to the incident electron beam. The charge accumulation in some examples has been observed to be several hundred volts or more, causing a deflection error of the electron beam with respect to the wafer of 15 microns or more. When it is desired to obtain positional accuracies of 0.1 micron or beter, an accumulated charge-caused positional error of 15 microns is, of course, intolerable.

In order to avoid or reduce the problem of accumulated charge-caused positional error, attempts have been made to conduct away the charge from the conductive region. One technique to avoid the problem employs etching away of the insulating layer to expose the conductive region thereby allowing electrical contact to the conductive region during electron beam exposure. In one process, the edge of the insulated wafer is dipped in an etching solution to remove the insulator and to permit contact to the conductive region. Such a step is generally unsatisfactory in that it is cumbersome and often results in contamination of the wafer surface. In order to help avoid contamination of the wafer surface, a special etching on the back side of the wafer has been employed. The back side etching is carried out by floating the wafer on the etching solution to dissolve the insulating layer formed on the back surface of the wafer. Such a float-etching process is cumbersome and when employed, it is still difficult to keep the top surface uncontaminated. None of the etching processes have proved entirely satisfactory.

In addition to the etching processes, mechanical abrasion or drilling steps have been attempted in order to penetrate the insulating layer in order to make electrical contact to the conductive region. These mechanical steps, however, form a dust from the abraded material which tends to contaminate the wafer surface.

Other mechanical and chemical methods of making electrical connection to the conductive region have not proved satisfactory and hence there is a need for an improved method and apparatus for forming electrical contact to a conductive region covered by an insulating layer. The improved method and apparatus is desirably one which is readily integrated into the conventional semiconductor processing steps.

SUMMARY OF THE INVENTION

The present invention is a method and apparatus for carrying out the steps of forming an electrical connection through an insulating layer to a conductive region and the improved semiconductor processes including such steps.

In accordance with the present invention, a wafer containing a conductive region covered by an insulating layer is mounted in a holder which is a good conductor, such as metal. Thereafter, a high-energy voltage potential is connected between the wafer and the holder causing an arcing across the insulating layer to the conductive region. The arcing causes one or more electrical connections between the conductive region and the holder through the insulating layer.

Semiconductor processes embodying the present invention employ, in connection with a wafer having a conductive region, the steps of forming an insulating layer covering the conductive region; forming a resist covering the insulating layer; mounting the wafer in a conductive holder applying a high-energy discharge between the wafer and the holder to cause electrical connections to be formed between the holder and the conductive region; and, exposing the holder-mounted wafer to an electron beam which scans a pattern whereby electrons injected into the conductive region are conducted away through the electrical connection between the conductive region and the holder. Thereafter, the exposed wafer is removed from the holder and processed to develop the pattern scanned by the electron beam. If additional electron beam patterns are to be similarly formed on the wafer thus processed, new resist layers are coated on the wafer, the coated wafer is again placed in the wafer holder, and a high-energy discharge is applied to again form an electrical connection between conductive regions in the mounted wafer and the wafer holder. Thereafter, the newly added resist is exposed by an electron beam apparatus and electrons injected into the conductive region are conducted away through the electrical connection between the holder and the wafer.

In accordance with the above summary, the present invention achieves the objective of providing a simple and convenient method and apparatus for performing the step of forming an electrical connection through an insulating layer to a conductive region and improved steps in the process of forming semiconductor devices whereby undesirable charge accumulation is avoided in semiconductor wafers during exposure to charged beams.

The foregoing and other objects, features and advantages of the invention will be apparent from the following more detailed description of preferred embodiments of the invention, as illustrated in the accompanying drawings.

BRIEF DESCRIPTION OF THE DRAWINGS

FIG. 1 depicts a partially schematic electrical and mechanical representation of an apparatus in accordance with the present invention.

FIG. 2 depicts a top view of a wafer holder and a wafer of the type utilized in the apparatus of FIG. 1.

FIG. 3 depicts a bottom view of the wafer holder and wafer of FIG. 2.

FIG. 4 shows a schematic electrical circuit diagram of the discharge device of FIG. 1 in accordance with the present invention.

FIG. 5 depicts a front view of an assembly for holding the discharge device, the wafer holder and other elements in accordance with the present invention.

FIG. 6 depicts a partial cross-sectional view of a partially processed semiconductor wafer and its connection to a portion of the wafer holder in accordance with the present invention.

FIG. 7 depicts a schematic presentation of the wafer holder exposed in an electron beam apparatus in accordance with the present invention.

DESCRIPTION OF THE PREFERRED EMBODIMENTS

In FIG. 1, an apparatus incorporating the present invention is shown. An electrical discharge device 7 is connected by one lead 8 to the surface of a semiconductor wafer 3. The discharge device 7 is connected by a second lead 9 to a conductive holder 10. The holder 10 is typically formed of any non-magnetic metal, such as a non-magnetic stainless steel. A non-magnetic metal is preferred in order to avoid the presence of a magnetic field which might adversely affect the electron beam. The holder 10 has an inner wall 29 which defines an opening 2. On the top surface 28 of the holder 10, a flange extends from the surface 28 over the wall 29 into a portion of the opening 2. The flange 21 provides a mechanical stop for a wafer 3 inserted from the bottom of the opening up against the bottom of the flange 21. The flange 21 is also preferably made of non-magnetic metal such as phosphor bronze. The wafer 3 sits on a bottom plate 6 which is typically a non-magnetic metal such as aluminum. The bottom plate 6 forces the wafer 3 up against the bottom of flange 21 through the operation of a leaf spring 25 which is rigidly attached to the holder 10 through the wall 29. Wafer 3 is additionally held in place against mechanical stops (not shown in FIG. 1) by operation of a plunger 22. Plunger 22 is spring loaded to force wafer 3 into contact with mechanical stops 23 and 24 (see FIG. 3). Further details of the holder 10 appear in the application "Wafer Holder With Spring-Loaded Wafer Holding Means".

In FIG. 1, the wafer 3 includes an inner conductive region 5 and an insulating layer 4. The conductive region 5 includes any material which will conduct charge carriers. For the purposes of the present invention, the term "conductive" is intended to apply to both good conductors such as metal and semiconductors such as doped silicon. In semiconductor technology, the region 5 is typically a P-type or N-type silicon. The insulating layer 4 is any non-conductive material. In semiconductor technology, the insulating layer 4 is typically silicon dioxide.

In FIG. 1, the discharge device 7 is any electrical device which has sufficient voltage and energy to force a current through the insulating layer 4 to form an electrical connection through the insulating layer 4 to the conductive region 5. For typical silicon dioxide layers utilized in conventional semiconductor processing, voltages ranging from 2000 volts to 20,000 volts are usually required to form the electrical connection. The formation of the desired electrical connection is verified by measuring the resistance between the holder 10 from line 9 to the surface of the wafer 3 at line 8. Before the electrical discharge is applied, the resistance through the holder 10 and the wafer 3, measured between lines 8 and 9, is more than 100 times $10^6$ ohms. After an electrical discharge from the discharge device 7, the electrical resistance is less than 1 times $10^6$ ohms and usually is in the order of between 10,000 and 50,000 ohms. The establishment of the electrical connection, as evidenced by the substantial reduction in resistance, is dependent upon driving sufficient current through the insulating layer.

While the exact nature of the phenomenon is not fully understood, it appears that an electrical discharge from the discharge device 7 causes arcing from the conductive region 5 across the insulating layer 4 to the conductive line 8 on one side, and, on the other side, from the conductive region 5 across the insulating layer 4 to the metal holder 10 connected to the line 9. The arcing across the insulating layer in at least two points causes a breakdown in the insulating layer if the discharge device 7 supplies sufficient energy. The break down in the insulating layer results in the electrical connection. When observed under a powerful microscope, the electrical connection through the insulating layer appears as a charred channel. The charred channel is apparently caused by localized heating and high-current density through the insulating layer which follows an arc discharge across the layer.

Whatever the phenomenon, the substantial reduction in the resistance between the conductive region 5 and the holder 10 permits electrons injected into region 5 by an electron beam to be conducted away by the holder in a manner to be described in further detail hereinafter.

In FIGS. 2 and 3, further details of the holder 10 of FIG. 1 are shown. The wafer 3 typically has a diameter D2 which measures approximately 7.5 centimeters and which is smaller than the diameter D3 of the opening defined by the circular wall 29. The holder 10 supports the circular flange 21 which defines an opening having a diameter D1 smaller than the wafer diameter D2. The outer diameter D4 of flange 21 is greater than the opening diameter D3 so that the flange 21 is partially supported by the surface of holder 10. The holder 10 of FIG. 2 includes a notch in one side 12 which is designed to be forced against a post 18 which serves as a mechanical stop for one edge of the holder 10. Two additional posts 18' and 18" are designed to serve as mechanical stops for another edge of the holder 10. The posts 18, 18' and 18" in FIG. 2 are shown with broken lines since they are not part of the holder 10 but form part of the holder engagement means in the assembly described in further detail hereinafter in connection with FIG. 5.

In FIG. 3, a bottom view of the wafer and holder of FIG. 2 is shown. The wafer 3 has been processed to cut an edge along the crystalline plane having an orientation—100—to define a wafer edge 35. The edge 35 of wafer 3 is positioned against the mechanical stops 23 which are rigidly connected to the flange 21 of the holder 10. An additional stop 24, also connected to the flange 21 is located approximately 90° from the stops 23. A spring-loaded plunger 22 is mounted in the holder 10 generally to contact a wafer so as to force the wafer against the stops 23 and 24 and thus rigidly hold the wafer in position. The wafer 3 is then additionally held in place by the spring 25. Spring 25 is pivotedly connected to the holder 10 by a bolt 26. Spring 25 may be rotated around the bolt 26 toward the notch 12 and into the recess 27 so that the wafer 3 and the base plate 6 may be easily inserted or removed from the opening 2. The view of the holder 10 and wafer 3 shown in FIG. 1 is taken along the section line VII—VII of FIG. 3. In a similar manner, as hereinafter described, FIG. 6 is a partial section of the semiconductor wafer and holder taken along the section line VI—VI of FIG. 3.

In FIG. 4, one preferred embodiment of the discharge device 7 of FIG. 1 is shown in further detail. The discharge device 7 is connected to a 60 Hz voltage source at terminals 50 through a power switch 15 to produce both a positive rectified voltage, +V, of 6 volts and a negative rectified voltage, −V, of −6 volts at the outputs of the conventional rectifier circuit 51. The positive output at node 52 is connected to a current limiting resistor 31 of 5 ohms, a primary coil 32 and a momentary contact switch 16 which is in turn connected to the collector of a switching transistor 34. The switching transistor 34 is operated to switch between a conducting and non-conducting state by an operational amplifier 38. Amplifier 38 provides on its output 54 a step signal of +V or −V switching at 60 Hz. The output 54 from amplifier 38 is connected to the base of transistor 34 and switches transistor 34 conducting and non-conducting at a rate of 60 Hz.

The secondary winding 33 includes many more turns than the primary winding 32 in order to achieve a step-up of 1 to 4,000 from primary to secondary. The output from the secondary coil 33 is typically up to 20,000 volts or higher. The secondary loop includes the series connection of the switch 36, shown in its normally closed position, and the holder and wafer assembly connected between lines 8 and 9 in the manner shown in FIG. 1.

In FIG. 4, the line 9 from the wafer holder of FIG. 1 connects to the common ground. The primary and secondary loops of the discharge device 7 of FIG. 4 are typically of the conventional type employed in automobile ignition systems as the spark plug coils. Additionally, the switch 36 can be switched to the phantom position to open the secondary loop and alternatively connect the ohm meter 19 across the leads 8 and 9. With switch 36 thus thrown to connect the ohm meter 19, the resistance between the holder 10 and the contact on the surface of a semiconductor 3, as shown in FIG. 1, may be readily measured.

While the circuit of FIG. 4 is one preferred embodiment of a discharge device, any equivalent electrical circuit may, of course, be employed. The important characteristic is that the device be capable of providing an output voltage of up to 20,000 volts or more and a driving current sufficient to cause insulation breakdown.

In FIG. 5, an assembly for holding the discharge device 7, the wafer holder 10 and other elements is shown. The assembly includes a base unit 11 which mechanically supports the ohm meter 19, the momentary contact switch 16 and the power switch 15. The holder 10 is placed against the positioning post 18 which serves as a mechanical stop. Holder 10 rests by the force of gravity on the base plate 39 and hence there is good electrical contact between base 39 and holder 10. The base plate 39 is electrically connected to the common ground as indicated in FIG. 4 which is the same as the lead line 9 of FIG. 1. Electrical connection and physical contact is made to the wafer 3 (not explicitly shown in FIG. 5) by the contact needle 13. Needle 13 is electrically connected through an insulating sleeve 14 and lead 8 to the discharge device as shown in FIGS. 1 and 4. The insulating sleeve 14 is rigidly connected to the cover 17. Cover 17 is typically a rigid plastic and is rotatable with respect to the base 11 and the holder 10 about the hinge 37. When the cover 17 is in the closed, down position as shown, the needle 13 is forced down into firm contact with the wafer surface. When the cover 17 is rotated up and around hinge 37, needle 13 is retracted from any contact with the wafer.

In FIG. 6, further details of a portion of a section, viewed along section line VI—VI of FIG. 3, of a partially processed semiconductor wafer 3, as mounted in the holder 10, are shown. In FIG. 6, the wafer 3 is in firm mechanical contact with the flange 21 and with the mechanical stop on the base plate 39 in the base unit 11. Additionally, the needle 13 makes firm mechanical contact with the upper surface 49 of the wafer 3.

The wafer 3 in FIG. 6 includes a number of regions and layers which are standard for semiconductor devices formed using standard metal oxide semiconductor (MOS) processing techniques.

The MOS processing steps are well known and are summarized as follows. First, a silicon nitride layer with a thickness of about 1500 angstroms is grown on the surface of the substrate 5 by a conventional gaseous-reaction method in a reaction tube through which a mixture of monosilane and ammonia are flowing. The silicon nitride layer is then selectively etched by a conventional plasma etching process using a photo resist as a mask. After this selective etching, the photo resist mask is removed. The silicon nitride remaining on the surface of the substrate 5 is then used as a mask for forming a silicon dioxide layer 4. The silicon dioxide layer 4 is grown by a thermal oxidation method to a thickness of about 6000 angstroms. After forming the silicon dioxide layer 4, the silicon-nitride masks are removed and the wafer substrate is placed in an oxidation furnace to regrow, on the surface of the substrate where no silicon dioxide layer 4 is present, an oxide layer 45 to about five hundred angstroms. Then, a polycrystalline silicon layer is formed over the layer 45 by using a conventional reaction tube into which monosilane is introduced in order to deposit the layer in a thickness of about four hundred angstroms.

To increase the conductivity of the polycrystalline silicon layer, the wafer is placed in an ion implantation device to implant phosphorous atoms.

After ion implantation, the polysilicon layer is etched by plasma etching to leave the polysilicon gate pattern 44. The wafer is then ready for implanting phosphorus ions to form N+ source and drain regions 42 and 43 using the polysilicon gate 44 as a mask for the implantation.

After conventional ion implantation, it is necessary to anneal the implanted wafer to distribute the implanted ions. During the annealing, the polysilicon gate 44 is covered by a new oxide layer 46 due to the annealling in an oxidizing atmosphere.

Next, an etching step is performed to remove the oxide layer above the source and drain regions 42 and 43 in order to form electrode windows 48. An aluminum layer 47 is formed by vacuum evaporation on the entire exposed surface of the wafer including contact through windows 48 to the source and drain regions 42 and 43.

At this point, an electron beam resist 49 is applied on the aluminum layer 47 by a conventional spin coating in the thickness of about one micron. Resist 49 is typically a negative resist meaning that the portion of the resist struck by an electron beam remains and the non-struck portion is subsequently removed. A typical negative resist is the copolymer (COP) resist marketed under license from Bell Laboratories. Of course, positive resists such as polymethyl methacrylate (PMMA) may also be employed in accordance with the present invention.

In FIG. 6, a cross sectional view of only one active element area of the wafer is shown as representative of many other such areas. A typical wafer, of course, includes many active regions similar to the one shown in FIG. 6. In FIG. 6, the semiconductor wafer 3 has been partially processed to the stage where the P-type silicon region 5 is covered with the field oxide layer 41. The ion implanted N+ regions 42 and 43 are facing each other in region 5 to form source and drain regions, respectively. The polysilicon gate layer 44 is on the relatively thin thermally grown silicon dioxide layer 45 and covered by an overlying oxide layer 46. The aluminum layer 47 covers the entire surface of the wafer 3 and contacts to the source region 42 and drain region 43 through the windows 48. The COP resist 49 is the uppermost layer.

In accordance with the present invention, the wafer 3 as thus far partially processed with the foregoing or similar steps, is placed in the wafer holder 10 of FIG. 6 in contact with the metal flange 21 and metal post 23 as previously shown and described in connection with FIGS. 1, 2 and 3. The wafer holder 10 and the partially processed wafer 3 are thereafter mounted on a discharge unit 11 as described in connection with FIG. 5. With the wafer holder 10 placed on top of the unit 11, the holder 10 is placed against the post 18 and sitting on the bottom plate 39. The cover 17 is closed forcing the contact needle 13 of FIG. 5 into the resist layer 49 as shown in FIG. 6. In this position, electrical contact is made through the holder 10 to one side of the discharge device 7 (see FIGS. 1 and 4) and to the wafer on the other side by needle 13. With the wafer and wafer holder thus positioned in the unit of FIG. 5, the switches 15 and 16 are closed to cause a high-voltage discharge from the discharge device 7 of FIGS. 1 and 4.

The electrical discharge applied to the wafer and holder of FIG. 6 causes an electrical connection 61 between the needle 13 and the aluminum layer 47. Additionally, one or more additional electrical connections 62, 63 or 64 connect between the region 5, the aluminum layer 47, the post 23 and the flange 21 to the holder 10. In the embodiment of FIG. 6, electrical connection 64 is shown between the aluminum layer 47 and the flange 21 through the resist layer 49 which is an insulating layer. Additionally, an electrical connection 62 is shown through the silicon dioxide layer 41 between the aluminum layer 47 and the region 5. Still additionally, an electrical connection 63 is shown through the silicon dioxide sidewall layer 4 and a portion of the resist layer 49 to the metal post 23. While the location of the electrical connection to the aluminum layer 47 is readily established, the locations of the electrical connections 62, 63 and 64 cannot readily be established visually without unwarranted difficulty. The existence of the electrical connections 62, 63 and 64 is readily established by the use of the ohm meter 19 as previously described in connection with FIG. 4. Additionally, the existence of the electrical connections is also established due to the lack of unwanted deflection of the electron beam due to an electrostatic field.

In many instances, the electrical connection 63 in the form of a conductive channel between the region 5 and the post 23 is readily formed as a result of the output from the discharge device. The existence of a conductive channel to form the electrical connection 63 frequently results because the oxide layer on the wall is irregularly formed as a result of the previously described processing steps and also as a result of the high compression of the wafer against the post 23 generally in the region indicated by the electrical connection 63. Since the phenomenon causing the conductive channel is believed to be as a result of current and heat generated after an arcing occurs between conductive regions on either side of an insulator, the actual location of the formed conductive channel will occur where the electrical impedance is the lowest (frequently where the insulator is the thinest).

In order to establish the electrical connection with a series resistance below 1 times $10^6$ ohms, one or more discharges, caused by momentary actuation of switch 16, are necessary. In order to insure the low resistance, the switch 36 can be thrown to connect the meter 19, as shown in FIG. 4, to measure the series resistance and insure that it is satisfactorily low. In the present specification and the drawings, the term "electrical connection" and the term "conductive channel" are each referring to any connection through an insulator which has a series resistance substantially lower than 100 times $10^6$ ohms. Of course, the lower the resistance of the electrical connection in the conductive channel, the more readily the injected electrons will be conducted away during electron beam processing. The greater the resistance of the electrical connection in the conductive channel, the greater the retained charge and hence the greater the charge-caused deflection error of the electron beam.

In a typical example, the electron beam current is $10^{-7}$ ampere. In semiconductor processing of the type described in the specification, an accumulated-charge-caused residual voltage of approximately 0.1 volts exists in the wafer when the series resistance of the electrical connection measures approximately 1 times $10^6$ ohms. Such a voltage of 0.1 volt has caused a positional displacement error in the incident electron beam of approximately 0.015 micron. Where such a small displacement error of 0.015 micron is acceptable, voltages of 0.1 volt are acceptable and hence the electrical connection of 1 times $10^6$ ohms is acceptable.

After the wafer 3 of FIG. 6 has had the electrical discharge applied so as to establish the electrical connection, the holder 10 and the connected wafer 3 are placed in an electron beam apparatus and exposed with any desired electron beam pattern. Since the electrical connection is present from the conductive regions (that is the aluminum layer 47 and the semiconductor base 5) no excessive charge accumulation occurs and the electron beam exposure is effected with a positional accuracy of greater than 0.1 micron. After the exposure, the wafer 3 of FIG. 6 is removed from the holder 10 for further conventional semiconductor processing. The non-exposed areas of the electron beam resist are dissolved away in a conventional solvent. The aluminum layer thus exposed is then etched away by conventional etching to form electrodes and other wiring in accordance with the non-removed portion of the aluminum layer 47. Thereafter, if additional steps including the application of an electron beam resist are to be utilized, the method and apparatus of the present invention are employed to cause an electrical discharge across the wafer and wafer holder after the resist has been applied. In this manner, an electrical connection having a conductive channel with a resistance less than 1 times $10^6$ ohms is established between the wafer and the holder prior to each exposure to an electron beam.

In FIG. 7, the wafer holder 10 and the connected wafer 3, viewed along section line VII—VII of FIG. 3, are positioned in an electron beam apparatus. The electron beam apparatus includes an electron beam source 65 positioned above the surface of the wafer 3 and the holder 10. The wafer 3 and holder 10 are positioned on a table 66 where the table is translatable in a plane normal to the access of the electron beam 60. When the wafer 3 has been processed to form the electrical connection in accordance with the present invention, the electron beam 60 from the electron beam source 65 is incident on the surface of the wafer 3 at a point 67. The location of point 67 is accurate within a positional error of less than 0.1 micron when the wafer and holder have been processed in accordance with the present invention. Electrons impinging on the surface of wafer 3 are injected across the insulating layer 4 and into the conductive region 5 due to the energy in the electron beam. Accumulated electrons in the region 5, however, are conducted through a conductive channel 64, for example, to the metal flange 21, to the remainder of the holder 10 to the metal table 66 of the electron beam apparatus. The charge from the conductive region 5 is thus discharged into a much larger ground plane.

In the absence of an electrical connection in accordance with the present invention, a charge is accumulated in the conductive region 5. Such a charge is generally uniformly distributed in the region 5. A uniformly distributed charge in the region 5 generates equal potential field lines 69 in accordance with well understood principles. With such an accumulated charge, the incident electron beam 60 passes through the equal potential field and tends to be deflected so as to be incident on the surface of the wafer 3 at point 68. The deflection, d1, of the point 68 from the desired point 67 may be as great as 15 microns or more, thereby substantially interferring with the desired accuracy of exposing the wafer with the electron beam.

In FIG. 7, the table 66 is relatively movable with respect to the electron beam source 65. After such a movement of table 66 so as to carry the holder 10 and the wafer 3, a second relative position is shown for the electron beam source 65'. The source in position 65' generates an electron beam 60' which, in accordance with the present invention is incident at point 67' on the surface of the wafer 3. In the absence of the electrical connection in accordance with the present invention, the electron beam 60' tends to be deflected away from the general center of the wafer 3 to a point 68'. Again the point 68' may be deflected from the desired point 67' by a displacement d2 which is up to 15 or more microns. In FIG. 7, it should be noted that the source 65 is relatively further away from the center of the wafer 3 than is the electron beam source 65'. Accordingly, the dimension d1 for the electron beam farther from the center tends to be greater than the deflection d2 for electron beam closer to the center of the wafer. The beam deflection as a function of the position of the table 66 in the plane normal to the incident electron beam tends to be a non-linear function which is a function of the flux field caused by the accumulated charge. Since the wafer 3 is surrounded by the metal of flange 21 and of the remainder of the holder 10, the equal potential field lines tend to be somewhat distorted. For this reason, it is preferrable to eliminate or substantially reduce the accumulated charge rather than trying to account for the distortion by an appropriate adjustment of the table position. Furthermore, the deflections d1 and d2 are not necessarily repeatible in that the accumulated charge in the region 5 may build up to such a great value that it arcs and discharges, for example, to the flange 21. Such an accumulated-charge-caused discharge does not generally result in the formation of an adequate conductive channel so that after further electron beam processing, a charge again accumulates absent the present invention. Accordingly, the charge accumulation tends to be somewhat random and unpredictable except when conducted away in accordance with the method and apparatus of the present invention.

FURTHER AND OTHER EMBODIMENTS

While the present invention has been described in connection with one MOS processing technique, many other semiconductor and other processing techniques can benefit by the present invention. For example, the lift-off electron beam semiconductor technology can also readily benefit from the present invention. In the lift-off electron beam technology, an electron beam resist is applied on the surface of a silicon wafer. The electron beam resist is applied over a thermally grown silicon dioxide layer and a silicon nitride layer formed in a conventional manner, for example, by the process steps previously discussed. Such a structure, unlike the example discussed in connection with FIG. 6, does not have an aluminum layer (such as layer 47 in FIG. 6). After the electron beam resist has been applied, the wafer is mounted in a holder 10 and the holder and wafer together are mounted in unit 11 of FIG. 5. The electrical discharge is applied to establish the electrical connection in a conductive channel between the silicon base through the silicon nitride and silicon dioxide layers. Again, the apparatus of FIG. 5 is employed to test the wafer and holder to establish that the electrical connection in the conductive channel has a series resistance of less than 1 times $10^6$ ohms. Thereafter, the wafer and holder are together placed in an electron beam apparatus of the type indicated in connection with FIG. 7 for electron beam exposure of the electron beam resist. Again, the electron beam can be positioned on the surface of the wafer with an accuracy of better than 0.1 microns. After the exposure, the wafer is removed from the holder and the electron beam resist is developed in a conventional manner. Thereafter, a suitable metal is deposited on the entire surface of the electron beam resist layer of the partially processed wafer. The lift-off is thereafter performed by dissolving or etching the electron beam resist to leave a desired metal pattern on the surface of the silicon nitride layer.

While the embodiments of the invention have been described generally in connection with semiconductor processing, the present invention is equally applicable to metal finishing in which a metal plate is covered by an electron beam resist with the accurate patterning on the metal plate.

In view of the foregoing, it is apparent that the electrical discharge method and apparatus of the present invention is a comparatively easy and a fully compatible invention for use with all types of processing steps in which a charged particle beam is utilized to expose a wafer or other substrate including a conductive region covered by an insulating layer.

While the invention has been particularly shown and described with reference to the preferred embodiments thereof, it will be understood by those skilled in the art that those changes in form and details may be made therein without departing from the spirit and the scope of the invention.

What is claimed is:

1. A process for electron beam exposure of a wafer comprising the steps of,
   covering a conductive region of a wafer with an insulating layer,
   forming an electron beam resist layer on said insulating layer to form a resist-coated wafer,
   mounting said resist-coated wafer in an electrically conducting wafer holder,
   applying a voltage between a surface of said insulated wafer and said wafer holder to cause an electrical connection between said conductive region and said wafer holder,
   engaging said wafer holder and the electrically connected wafer in an electron beam apparatus, and
   exposing said resist layer to an electron beam in the electron beam apparatus whereby a current caused by said electron beam is conducted through said electrical connection.

2. A process for manufacturing a semiconductor device comprising the steps of,
   forming an insulating layer on a conductive region of a semiconductor wafer,
   forming an electron beam resist layer on said insulating layer to form a resist-coated insulated wafer,
   mounting said resist-coated insulated wafer in a wafer holder,
   applying a voltage between a surface of said resist-coated insulated wafer and said holder to cause an electrical connection between said conductive region and said holder,
   engaging said holder and mounted wafer in an electron beam apparatus, and
   exposing said resist layer to an electron beam.

3. The process of claim 2 wherein said voltage is applied with a value greater than 2000 volts.

4. The process of claim 3 wherein said voltage is applied with circuit means generating a current sufficient to cause a permanent channel connection in said resist-coated insulated wafer whereby a low series resistance is established between said resist-coated insulated wafer and said holder.

5. The process of claim 4 wherein said voltage and current are applied until said series resistance is below one times $10^6$ ohms.

6. The process of claim 2 wherein said voltage is applied through a needle contacting the surface of said resist-coated insulated wafer.

7. The process of claim 2 wherein said exposing of said resist layer occurs with an electron beam having a current of up to $10^{-7}$ ampere.

8. The process of claim 2 wherein, after application of said voltage, the series resistance between said wafer and said holder is measured.

9. The process of claim 8 wherein said voltage is successfully applied until said series resistance has been reduced below $10^6$ ohms.

* * * * *